United States Patent
Muehlmann et al.

(10) Patent No.: US 11,206,170 B2
(45) Date of Patent: Dec. 21, 2021

(54) COMMUNICATIONS DEVICE AND METHOD FOR OPERATING A COMMUNICATIONS DEVICE

(71) Applicant: NXP B.V., Eindhoven (NL)

(72) Inventors: Ulrich Andreas Muehlmann, Graz (AT); Stefan Mendel, Graz (AT); Steve Charpentier, Antibes (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/704,262

(22) Filed: Dec. 5, 2019

(65) Prior Publication Data
US 2020/0204427 A1 Jun. 25, 2020

(30) Foreign Application Priority Data
Dec. 19, 2018 (EP) ..................................... 18306748

(51) Int. Cl.
*H04L 27/36* (2006.01)
*H04L 27/38* (2006.01)
*H03D 7/14* (2006.01)

(52) U.S. Cl.
CPC ............. *H04L 27/362* (2013.01); *H03D 7/14* (2013.01); *H03D 7/1433* (2013.01); *H04L 27/38* (2013.01)

(58) Field of Classification Search
CPC ................. H03D 7/1441; H03D 3/009; H03D 2200/0082; H03D 2200/0088; H03D 3/008; H03D 7/14; H03D 2200/0043; H03D 7/12; H03D 1/2245; H03D 7/1433; H03D 7/161; H04L 27/362; H04L 27/38; H04L 27/3818–3872

USPC ........................................... 375/260; 382/106
See application file for complete search history.

(56) References Cited

U.S. PATENT DOCUMENTS

| | | | | |
|---|---|---|---|---|
| 4,862,098 A | * | 8/1989 | Yassa | H03D 1/22 329/358 |
| 5,097,220 A | * | 3/1992 | Shimakata | H04L 27/2332 329/306 |
| 5,153,527 A | * | 10/1992 | Yaguchi | H04L 1/206 329/307 |
| 5,287,067 A | * | 2/1994 | Denno | H04L 27/2332 329/304 |
| 5,471,508 A | * | 11/1995 | Koslov | H04L 27/3872 375/261 |
| 5,592,235 A | * | 1/1997 | Park | H04N 7/015 348/555 |
| 5,602,881 A | * | 2/1997 | Shiino | H04L 27/2273 375/371 |
| 5,636,252 A | * | 6/1997 | Patel | H04N 5/4401 375/345 |

(Continued)

*Primary Examiner* — James M Perez

(57) ABSTRACT

Embodiments of communications devices and methods for operating a communications device are described. In an embodiment, a communications device includes a complex multiplier configured to multiply a first input complex signal with a second input complex signal to generate an output complex signal, an amplifier configured to amplify an imaginary part of the output complex signal to generate an amplification result, a delay element configured to delay a rotation angle signal that is related to the second input complex signal, and a subtractor configured to subtract the amplification result from the delayed rotation angle signal to generate the rotation angle signal. Other embodiments are also described.

15 Claims, 5 Drawing Sheets

(56) References Cited

U.S. PATENT DOCUMENTS

| | | | | |
|---|---|---|---|---|
| 5,663,992 A * | 9/1997 | Farmer | H03L 7/0994 | 375/371 |
| 5,796,786 A * | 8/1998 | Lee | H04L 27/3827 | 375/326 |
| 5,799,037 A * | 8/1998 | Strolle | H03J 7/04 | 375/233 |
| 5,920,228 A * | 7/1999 | Soga | H04L 27/3872 | 329/304 |
| 6,144,708 A * | 11/2000 | Maruyama | H03D 3/009 | 375/324 |
| 6,310,513 B1 * | 10/2001 | Iemura | H03D 3/009 | 329/304 |
| 6,363,102 B1 * | 3/2002 | Ling | H04L 27/2332 | 375/147 |
| 6,483,883 B1 * | 11/2002 | Iemura | H04L 27/3809 | 370/204 |
| 6,487,260 B1 * | 11/2002 | Schweickert | H04L 27/148 | 375/334 |
| 6,668,025 B1 * | 12/2003 | Sumi | H03D 3/007 | 375/326 |
| 6,748,029 B1 * | 6/2004 | Lee | H04L 27/066 | 375/326 |
| 6,842,495 B1 * | 1/2005 | Jaffe | H04L 27/3827 | 375/326 |
| 6,898,235 B1 * | 5/2005 | Carlin | H04B 1/001 | 342/147 |
| 6,904,098 B1 * | 6/2005 | Isaksen | H03J 7/02 | 375/261 |
| 7,376,690 B2 * | 5/2008 | Van Den Enden | H03H 17/045 | 708/313 |
| 7,382,297 B1 * | 6/2008 | Kopikare | H03C 5/00 | 341/118 |
| 7,433,298 B1 * | 10/2008 | Narasimhan | H04L 25/0228 | 370/206 |
| 7,456,683 B2 * | 11/2008 | Takano | H04L 27/3863 | 329/349 |
| 7,826,564 B2 * | 11/2010 | Jensen | H03D 3/24 | 375/327 |
| 7,856,048 B1 * | 12/2010 | Smaini | H04B 1/40 | 375/221 |
| 8,532,233 B2 * | 9/2013 | Shimomura | H04L 27/2657 | 375/343 |
| 9,197,268 B1 * | 11/2015 | Petrovic | H03D 3/009 | |
| 9,641,274 B2 * | 5/2017 | Kerhuel | H04L 5/00 | |
| 9,780,891 B2 * | 10/2017 | Eo | H04B 17/0085 | |
| 9,893,876 B2 * | 2/2018 | Moehlmann | H03L 7/093 | |
| 9,893,924 B2 * | 2/2018 | Smail | H04L 27/265 | |
| 10,033,413 B2 * | 7/2018 | Pratt | H03F 1/3294 | |
| 10,367,667 B2 * | 7/2019 | Muehlmann | G06K 7/10019 | |
| 10,484,108 B1 * | 11/2019 | Al-Qaq | H04B 17/11 | |
| 10,735,038 B2 * | 8/2020 | Srinivasan | H04B 17/318 | |
| 2002/0057752 A1 * | 5/2002 | Denno | H03D 3/009 | 375/346 |
| 2002/0126771 A1 * | 9/2002 | Li | H03D 7/166 | 375/324 |
| 2003/0231726 A1 * | 12/2003 | Schuchert | H04L 25/03159 | 375/350 |
| 2004/0062322 A1 * | 4/2004 | Sachse | H04L 27/2273 | 375/308 |
| 2004/0136474 A1 * | 7/2004 | Hwang | H04L 27/02 | 375/326 |
| 2005/0008084 A1 * | 1/2005 | Zhidkov | H04L 25/03184 | 375/260 |
| 2005/0013389 A1 * | 1/2005 | Mizukami | H04L 27/2271 | 375/323 |
| 2005/0207514 A1 * | 9/2005 | Hayashi | H04L 27/3872 | 375/326 |
| 2006/0115019 A1 * | 6/2006 | Jensen | H03D 3/24 | 375/327 |
| 2007/0091996 A1 * | 4/2007 | Yu | H04L 25/03038 | 375/233 |
| 2007/0189195 A1 * | 8/2007 | Belotserkovsky | H03L 7/10 | 370/315 |
| 2008/0013616 A1 * | 1/2008 | Kim | H04H 40/27 | 375/232 |
| 2008/0030264 A1 * | 2/2008 | Takano | H04L 27/3863 | 329/304 |
| 2008/0187038 A1 * | 8/2008 | Currivan | H04L 27/0014 | 375/233 |
| 2008/0204092 A1 * | 8/2008 | Moehlmann | H03L 7/093 | 327/156 |
| 2008/0267273 A1 * | 10/2008 | Aue | H04L 27/2662 | 375/224 |
| 2009/0034652 A1 * | 2/2009 | Song | H04W 4/06 | 375/296 |
| 2009/0103655 A1 * | 4/2009 | Arnold | H03D 3/009 | 375/322 |
| 2009/0129509 A1 * | 5/2009 | Choi | H04L 1/005 | 375/326 |
| 2009/0141786 A1 * | 6/2009 | Park | H04L 27/2647 | 375/227 |
| 2009/0141831 A1 * | 6/2009 | Tao | H04B 10/69 | 375/325 |
| 2009/0143042 A1 * | 6/2009 | Kawai | H04B 1/126 | 455/296 |
| 2009/0175474 A1 * | 7/2009 | Salvetti | H04M 9/082 | 381/318 |
| 2009/0225814 A1 * | 9/2009 | Bastug | H04B 1/7105 | 375/147 |
| 2009/0227215 A1 * | 9/2009 | McCallister | H03F 1/0211 | 455/114.3 |
| 2009/0323683 A1 * | 12/2009 | Song | H04N 21/235 | 370/389 |
| 2010/0074387 A1 * | 3/2010 | Mendel | H03L 7/0991 | 375/376 |
| 2010/0136916 A1 * | 6/2010 | Kawai | H04B 7/002 | 455/63.1 |
| 2010/0166049 A1 * | 7/2010 | Ahirwar | H04L 27/3863 | 375/221 |
| 2010/0202552 A1 * | 8/2010 | Sakai | H04L 27/2662 | 375/267 |
| 2010/0296568 A1 * | 11/2010 | Bury | H04L 27/2647 | 375/227 |
| 2010/0302083 A1 * | 12/2010 | Helfenstein | H04L 27/364 | 341/118 |
| 2011/0032974 A1 * | 2/2011 | Karino | H04B 1/7075 | 375/142 |
| 2011/0044408 A1 * | 2/2011 | Ahmad | H04L 27/2675 | 375/340 |
| 2012/0128103 A1 * | 5/2012 | Soga | H04L 25/0262 | 375/340 |
| 2012/0177151 A1 * | 7/2012 | Hormis | H04L 27/3863 | 375/340 |
| 2012/0269298 A1 * | 10/2012 | Mazzucco | H04L 27/3872 | 375/329 |
| 2013/0108276 A1 * | 5/2013 | Kikuchi | H04B 10/697 | 398/158 |
| 2013/0279560 A1 * | 10/2013 | Currivan | G06F 1/3278 | 375/233 |
| 2015/0372766 A1 * | 12/2015 | Yoshida | H04B 10/61 | 398/193 |
| 2016/0127164 A1 * | 5/2016 | Muhammad | H04L 27/365 | 375/297 |
| 2016/0191020 A1 * | 6/2016 | Velazquez | H03H 21/0067 | 341/118 |
| 2018/0242269 A1 * | 8/2018 | Gou | H04L 27/364 | |
| 2019/0097866 A1 * | 3/2019 | Sestok, IV | H04L 27/3863 | |
| 2019/0104003 A1 * | 4/2019 | Muehlmann | H04B 5/0062 | |
| 2019/0190554 A1 * | 6/2019 | Srinivasan | H04B 1/12 | |
| 2020/0084068 A1 * | 3/2020 | Beidas | H04L 27/0014 | |
| 2020/0204427 A1 * | 6/2020 | Muehlmann | H04L 27/38 | |

* cited by examiner

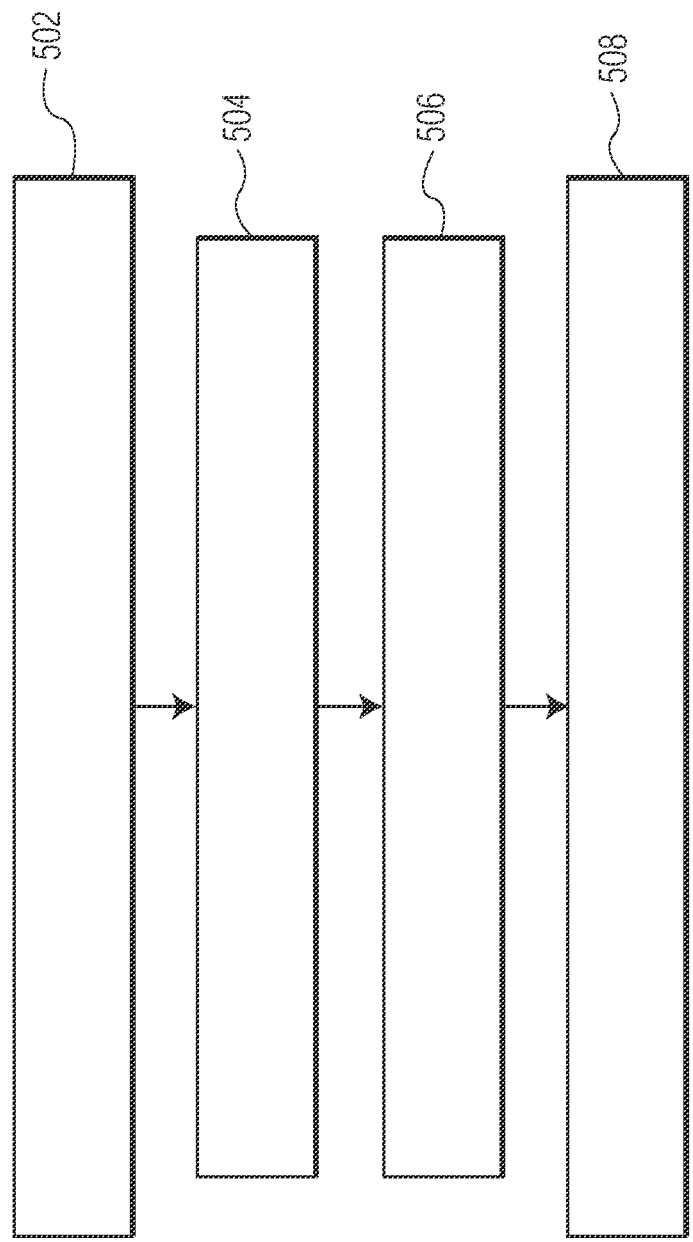

COMMUNICATIONS DEVICE AND METHOD FOR OPERATING A COMMUNICATIONS DEVICE

CROSS-REFERENCE TO RELATED APPLICATIONS

This application claims priority under 35 U.S.C. § 119 to European Patent Application No. 18306748.7, filed on Dec. 19, 2018, the contents of which are incorporated by reference herein.

BACKGROUND

Communications devices that communicate with each other wirelessly can be affected by materials used in the communications devices and/or environmental factors. For example, many wireless communications devices (e.g., mobile devices) are encapsulated in metal enclosures, which can affect magnetic field distributions. Consequently, communications performance may degrade in corner cases (e.g., when a wireless communications device is too close to a corresponding wireless communications device or is too far away from a corresponding wireless communications device). For example, parasitic phase modulation may be introduced, which can cause loss of phase information and/or loss of magnitude gradient and therefore can impact the accuracy of a recovered clock signal. Inaccurate clock signal recovery can negatively impact data reception.

SUMMARY

Embodiments of communications devices and methods for operating a communications device are described. In an embodiment, a communications device includes a complex multiplier configured to multiply a first input complex signal with a second input complex signal to generate an output complex signal, an amplifier configured to amplify an imaginary part of the output complex signal to generate an amplification result, a delay element configured to delay a rotation angle signal that is related to the second input complex signal, and a subtractor configured to subtract the amplification result from the delayed rotation angle signal to generate the rotation angle signal. Other embodiments are also described. In an embodiment, the first input complex signal includes a real part that is a baseband in-phase (I) component and an imaginary part that is a baseband quadrature (Q) component. In an embodiment, the communications device further includes a baseband IQ demodulator configured to generate the baseband in-phase (I) and quadrature (Q) components based on a radio frequency (RF) input signal.

In an embodiment, the baseband IQ demodulator includes a clock source configured to generate a clock signal, and wherein the baseband IQ demodulator is configured to generate the baseband in-phase (I) and quadrature (Q) components based on the RF input signal and the clock signal.

In an embodiment, wherein the second input complex signal is represented as:

$\cos(phi(j))+1i*\sin(phi(j))$, where phi is the rotation angle signal, and where j is complex unit.

In an embodiment, the complex multiplier is configured to output a real part of the output complex signal for decoding.

In an embodiment, the communications device further includes a decoder configured to decode a real part of the output complex signal.

In an embodiment, the amplifier is configured to amplify the imaginary part of the output complex signal by an amplification gain.

In an embodiment, a communications device includes a baseband IQ demodulator configured to generate baseband in-phase (I) and quadrature (Q) components based on a radio frequency (RF) input signal and a phase rotator connected to the baseband IQ demodulator. The phase rotator includes a complex multiplier configured to multiply a first input complex signal with a second input complex signal to generate an output complex signal, where the first input complex signal comprises a real part that is the baseband in-phase (I) component and an imaginary part that is the baseband quadrature (Q) component, and where the complex multiplier is configured to output a real part of the output complex signal for decoding, an amplifier configured to amplify an imaginary part of the output complex signal to generate an amplification result, a delay element configured to delay a rotation angle signal that is related to the second input complex signal, and a subtractor configured to subtract the amplification result from the delayed rotation angle signal to generate the rotation angle signal.

In an embodiment, the baseband IQ demodulator includes a clock source configured to generate a clock signal, and wherein the baseband IQ demodulator is configured to generate the baseband in-phase (I) and quadrature (Q) components based on the RF input signal and the clock signal.

In an embodiment, the second input complex signal is represented as:

$\cos(phi(j))+1i*\sin(phi(j))$, where phi is the rotation angle signal, and where j is complex unit.

In an embodiment, the communications device further includes a decoder configured to decode the real part of the output complex signal.

In an embodiment, a method for operating a communications device involves multiplying a first input complex signal with a second input complex signal to generate an output complex signal, amplifying an imaginary part of the output complex signal to generate an amplification result, delaying a rotation angle signal that is related to the second input complex signal, and subtracting the amplification result from the delayed rotation angle signal to generate the rotation angle signal.

In an embodiment, the first input complex signal includes a real part that is a baseband in-phase (I) component and an imaginary part that is a baseband quadrature (Q) component.

In an embodiment, the method further involves generating the baseband in-phase (I) and quadrature (Q) components based on a radio frequency (RF) input signal.

In an embodiment, the method further involves obtaining a clock signal, wherein generating the baseband in-phase (I) and quadrature (Q) components based on the RF input signal comprises generating the baseband in-phase (I) and quadrature (Q) components based on the RF input signal and the clock signal.

In an embodiment, the second input complex signal is represented as:

$\cos(phi(j))+1i*\sin(phi(j))$, where phi is the rotation angle signal, and where j is complex unit.

In an embodiment, the method further involves outputting a real part of the output complex signal for decoding.

In an embodiment, the method further involves decoding a real part of the output complex signal.

In an embodiment, amplifying the imaginary part of the output complex signal involves amplifying the imaginary part of the output complex signal by an amplification gain.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

FIG. 5 is a process flow diagram of a method for operating a communications device in accordance with an embodiment of the invention.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
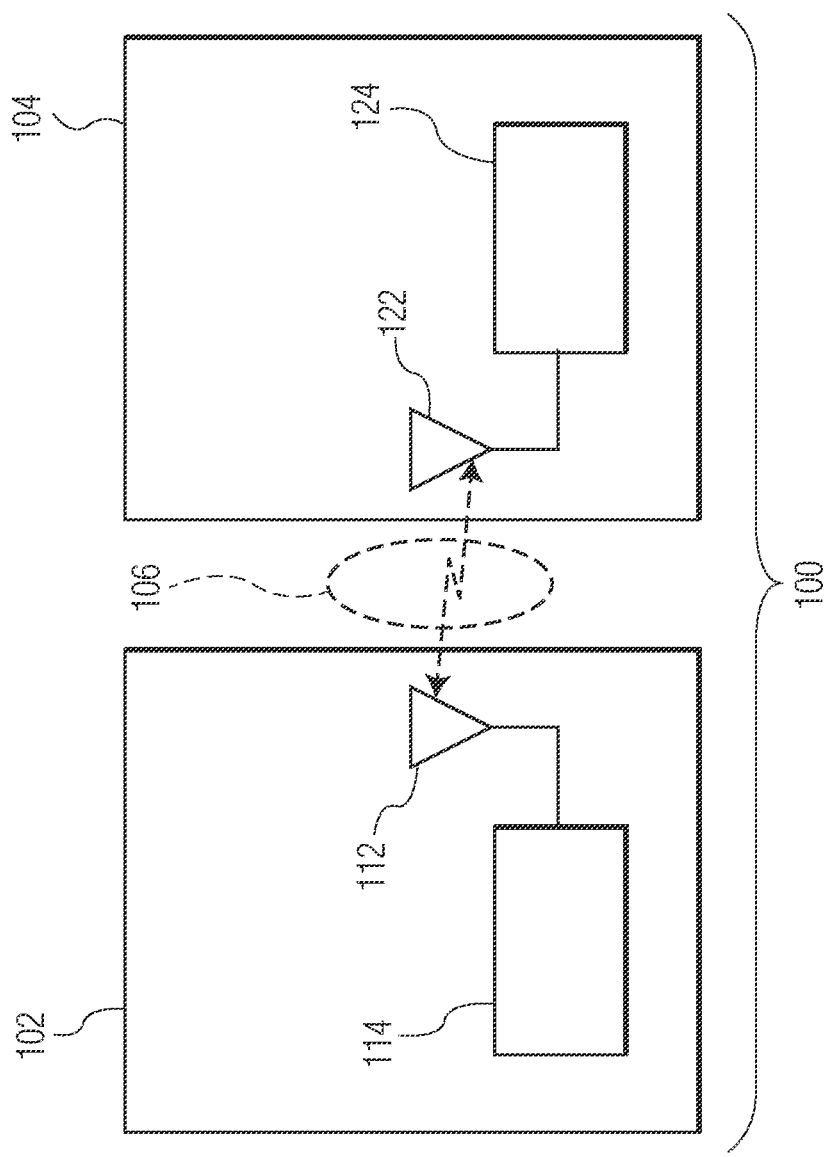
FIG. 1 depicts an embodiment of a communications device that can be used with a counterpart communications device to form a communications system.

FIG. 1 depicts an embodiment of a communications device 102 that can be used with a counterpart communications device 104 to form a communications system 100. In the communications system depicted in FIG. 1, the communications device 102 communicates with the counterpart communications device 104 via a communications channel 106. In some embodiments, the communications device 102 is a card/transponder device or the communications device 102 is in a "card-mode" in which the communications device 102 behaves as a card/transponder device and the counterpart communications device 104 is a dedicated reader device or a communications device in "reader-mode" in which the counterpart communications device 104 behaves as a reader device. In some other embodiments, the communications device 102 is a reader device or the communications device is in a reader mode and the counterpart communications device 104 is a dedicated card device or a communications device in card-mode.

In the embodiment depicted in FIG. 1, the communications device 102 includes an antenna 112 and an RF transceiver 114 configured to receive incoming RF signals from the antenna and/or to transmit outgoing RF signals through the antenna. The antenna may be any suitable type of antenna. In some embodiments, the antenna is an induction type antenna such as a loop antenna or any other suitable type of induction type antenna. However, the antenna is not limited at an induction type antenna. The communications device may be fully or partially implemented as an integrated circuit (IC) device. In some embodiments, the communications device is a handheld computing system or a mobile computing system, such as a mobile phone that includes one or more IC devices. Although the illustrated communications device is shown with certain components and described with certain functionality herein, other embodiments of the communications device 102 may include fewer or more components to implement the same, less, or more functionality.

In some embodiments, the communications device 102 communicates with other communications devices (e.g., the counterpart communications device 104) via inductive coupling. For example, the communications device 102 is a near field communications (NFC) device that uses magnetic field induction for communications in close proximity. The communications device 102 can be configured for either passive load modulation (PLM) or active load modulation (ALM). In some embodiments, the communications device is implemented as an RF transponder that is compatible with the International Organization for Standardization (ISO)/the International Electrotechnical Commission (IEC) 14443 standard that may operate at 13.56 MHz. In these embodiments, the antenna 112 is an induction type antenna such as a loop antenna or any other suitable type of induction type antenna.

In the embodiment depicted in FIG. 1, the counterpart communications device 104 includes an antenna 122 and an RF transceiver 124 configured to receive incoming RF signals from the antenna 122 and/or to transmit outgoing RF signals through the antenna 122. The antenna may be any suitable type of antenna. In some embodiments, the antenna is an induction type antenna such as a loop antenna or any other suitable type of induction type antenna. However, the antenna is not limited at an induction type antenna. The counterpart communications device 104 may be fully or partially implemented as an IC device. In some embodiments, the counterpart communications device is a handheld computing system or a mobile computing system, such as a mobile phone. Although the illustrated counterpart communications device is shown with certain components and described with certain functionality herein, other embodiments of the counterpart communications device may include fewer or more components to implement the same, less, or more functionality.

In some embodiments, the counterpart communications device 104 communicates with other communications devices (e.g., the communications device 102) via inductive coupling. For example, the counterpart communications device 104 is an NFC device that uses magnetic field induction for communications in close proximity. The counterpart communications device can be configured for either PLM or ALM. In some embodiments, the counterpart communications device is implemented as an RF transponder that is compatible with the ISO/IEC 14443 standard that may operate at 13.56 MHz. In the embodiments, the antenna 122 is an induction type antenna such as a loop antenna or any other suitable type of induction type antenna.

In an example operation of the communications system 100, an RF signal is received by the antenna 112 of the communications device 102 from the antenna 122 of the counterpart communications device 104 and is passed to the RF transceiver 114 of the communications device 102 to convert the RF signal into a digital signal, which can be further processed by a digital processor. A signal may be generated in response to the RF signal and is used to produce an outgoing RF signal at the RF transceiver 114, which may be transmitted to the counterpart communications device using the antenna 112.

Figure 2:
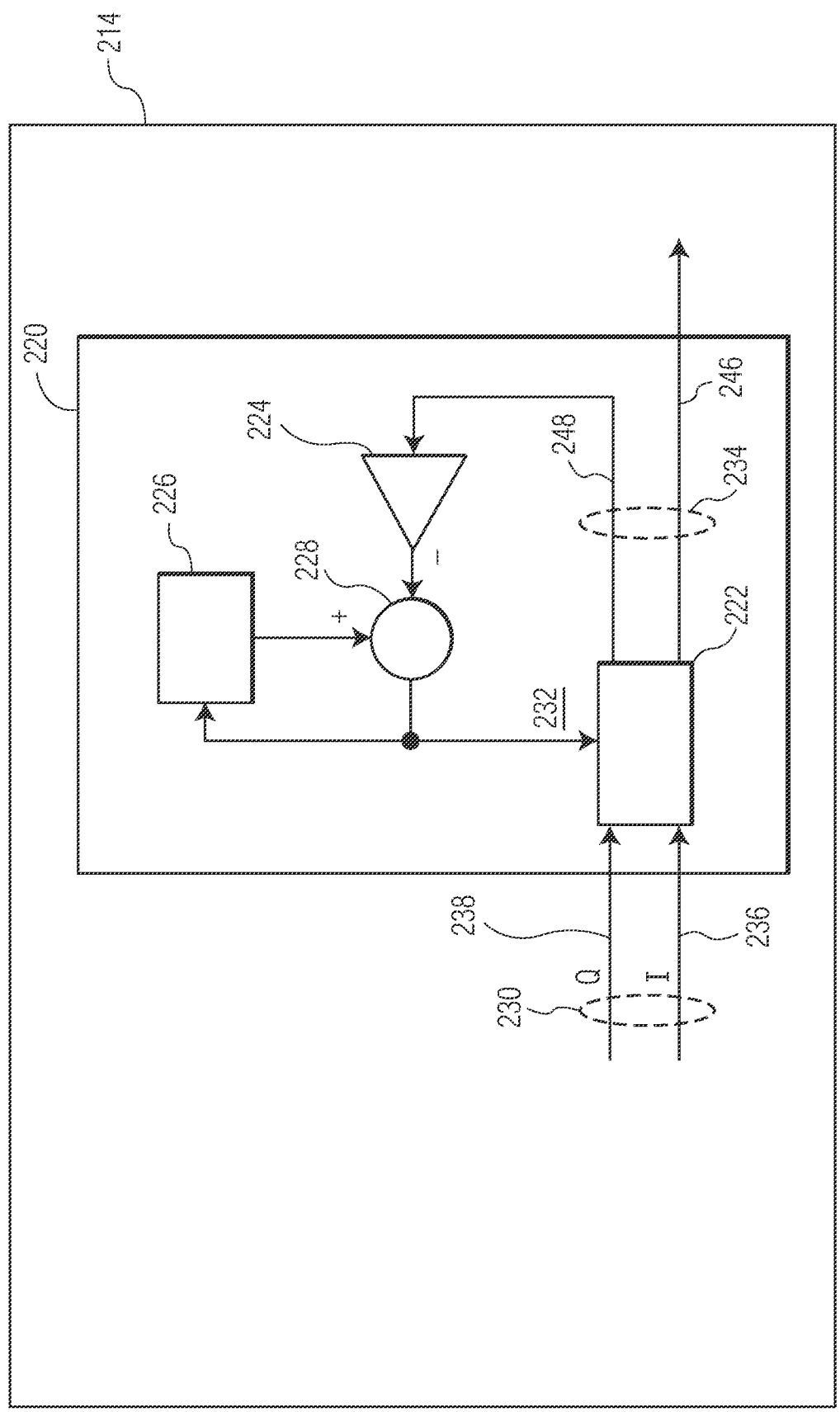
FIG. 2 depicts an embodiment of a receiver unit, which may be an embodiment of an RF transceiver of the communications device and/or an RF transceiver of the counterpart communications device depicted in FIG. 1.

FIG. 2 depicts a receiver unit 214 that is an embodiment of the RF transceiver 114 of the communications device 102 and/or the RF transceiver 124 of the counterpart communications device 104 depicted in FIG. 1. In the embodiment depicted in FIG. 2, the receiver unit includes a phase rotator 220, which includes a complex multiplier 222, an amplifier 224, a delay element 226, and a subtractor 228. Each of the complex multiplier, the amplifier, the delay element, and the subtractor may be implemented as hardware, software, firmware, and/or a combination of hardware, software, and/or firmware. In some embodiments, at least one of the complex multiplier, the amplifier, the delay element, and the subtractor is implemented as a processor such as a microcontroller or a central processing unit (CPU). The receiver unit depicted in FIG. 2 is a possible implementation of the RF transceiver 114 or 124 depicted in FIG. 1. However, the RF transceiver 114 or 124 depicted in FIG. 1 can be implemented differently from the receiver unit depicted in FIG. 2.

Compared to a receiver that relies on a recovered clock for data reception, the receiver unit 214 depicted in FIG. 2 does not rely solely on a clock-recovery mechanism for data reception and decoding. For example, the phase rotator 220 can operate with a local clock source (e.g., a local oscillator), which is used to generate input data for the phase rotator. Because the receiver unit depicted in FIG. 2 does not rely solely on a clock-recovery mechanism for data reception and decoding, parasitic phase modulation that may be introduced based on the proximity between the communications devices does not affect data reception and decoding at the corresponding receiver unit.

In the embodiment depicted in FIG. 2, the complex multiplier 222 is configured to multiply an incoming complex signal (also referred to as a first input complex signal) 230 with a second input complex signal 232 to generate an output complex signal 234. In some embodiments, the first input complex signal includes a real part that is a baseband in-phase (I) component 236 and an imaginary part that is a baseband quadrature (Q) component 238. In some embodiments, the baseband in-phase (I) and quadrature (Q) components are derived from an RF signal that is received by the antenna 112 or the antenna 122. In some embodiments, the complex multiplier is configured to output a real part of the output complex signal for decoding.

In the embodiment depicted in FIG. 2, the complex multiplier 222, the amplifier 224, the delay element 226, and the subtractor 228 form a phase rotation loop that continuously rotates the first input complex signal 230 to reduce the imaginary part 248 of the output complex signal 234 such that encoded information is predominantly carried by the real part 246 of the output complex signal. In some embodiments, the imaginary part of the output complex signal is changed (e.g., reduced or increased) to zero by the phase rotation loop. For example, the imaginary part is reduced from a positive number (e.g., 100 or other suitable number) to 0 by the phase rotation loop. Because the information is predominantly carried by the real part of the output complex signal, information can be decoded from the real part of the output complex signal by a digital signal processor (e.g., using decoding and bit-slicing operations to form the logical representations of true and false), thereby reducing or even eliminating the need to decode the imaginary part of the output complex signal to recover the carried information. Consequently, a separate decoder is not needed to decode the imaginary part of the output complex signal. Additionally, a separate/parallel decoding and bit-slicing chain is not needed within a digital decoder to decode the real part of the output complex signal.

In the embodiment depicted in FIG. 2, the amplifier 224 is configured to amplify the imaginary part 248 of the output complex signal 234 to generate an amplification result. In some embodiments, the amplifier is configured to amplify the imaginary part of the output complex signal by an amplification gain. The amplification gain may be fixed or programmable. The amplifier may be implemented with one or more suitable digital circuits.

In the embodiment depicted in FIG. 2, the delay element 226 is configured to delay a rotation angle signal phi related to the second input complex signal 232. For example, the delayed rotation angle signal has a waveform that is identical to the waveform of the rotation angle signal phi only delayed by a certain amount of time. The delay element may be implemented with one or more suitable digital circuits. For example, the delay element may be implemented using one or more adjustable capacitors and/or one or more variable resistors.

In the embodiment depicted in FIG. 2, the subtractor 228 is configured to subtract the amplification result from the delayed rotation angle signal to generate the rotation angle signal phi. The subtractor may be implemented with one or more suitable digital logic circuits.

In some embodiments, the complex multiplier 222 is configured to rotate the incoming complex signal 230 by exp(j*phi), where phi is the rotation angle signal that is controlled by the phase rotation loop and j is complex unity. In these embodiments, the output complex signal 234 of the complex multiplier can be expressed as:

$$c\_xout=(\cos(phi(j))+1i*\sin(phi(j)))*(i\_data\_d(j)+1i*q\_data\_d(j)),\quad(1)$$

where c_xout represents the output complex signal, phi represents the rotation angle signal, cos represents the Cosine function, sin represents the Sine function, i_data_d(j) represents the baseband in-phase (I) component of the incoming complex signal, q_data_d(j) represents the baseband quadrature (Q) component of the incoming complex signal, i_data_d(j)+1i*q_data_d(j) represents the incoming complex signal, cos(phi(j))+*sin(phi(j)) represents the second input complex signal 232. The real part 246 of the output complex signal can be expressed as:

$$i\_xout(j)=\text{real}(c\_xout)\quad(2)$$

where c_xout represents the output complex signal, real represents a real function that returns the real part of a given complex number, and i_xout(j) presents the real part of the output complex signal. The imaginary part 248 of the output complex signal can be expressed as:

$$q\_xout(j)=\text{imag}(c\_xout)\quad(3)$$

where c_xout represents the output complex signal, imag represents an imaginary function that returns the imaginary part of a given complex number, and q_xout(j) represents the imaginary part of the output complex signal. The phase rotation loop starts with an initial phase rotation angle signal phi and updates the phase rotation angle signal phi dependent on a signal phe that is input into the amplifier. The signal phe can be expressed as:

$$phe=q\_xout(j)\quad(4)$$

where q_xout(j) represents the imaginary part of the output complex signal. The speed of phase rotation regulation is governed by the amplification gain ag of the amplifier, which is also referred to as the regulation constant. The amplification gain ag may be constant or variable and reprogrammable. In some embodiments, reference values for the complex multiplier are stored in a storage device (e.g., memory) in order to minimize the implementation complexity. The phase rotation angle signal phi can be expressed as:

$$phi(j)=phi(j-1)-ag*phe\quad(5)$$

where phi(j) represents the rotation angle signal and phi(j-1) represents the delayed rotation angle signal, which is a delayed version of the rotation angle signal.

Table 1 provides example operating parameters of the phase rotator 220 depicted in FIG. 2 in an example operation of the phase rotator. In the example operation, the baseband in-phase (I) component, i_data_d(j), of the incoming complex signal 230 and the baseband quadrature (Q) component, q_data_d(j), of the incoming complex signal are both set to 100 and the amplification gain ag of the amplifier 224 is set to 0.2. Initially, the value of rotation angle signal, phi(j), is at 0. Based on equation (1), during a first clock cycle, the complex multiplier 222 generates an output complex signal 234 whose the real part i_xout(j) and the imaginary part q_xout(j) are both at 100. At the end of the first clock cycle, the value of rotation angle signal, phi(j), is updated to 0−0.2*100, which is −20 degrees, based on equation (5). During a second clock cycle, because the rotation angle signal, phi(j), is at −20 degrees, the complex multiplier generates an output complex signal whose the real part i_xout(j) is around 128.17 and the imaginary part q_xout(j) is around 59.77 based on equation (1). At the end of the second clock cycle, the value of rotation angle signal, phi(j), is updated to −20−0.2*59.77, which is around −31.95 degrees, based on equation (5). During a third clock cycle, because the value of rotation angle signal, phi(j), is around −31.95 degrees, the complex multiplier generates an output complex signal whose the real part i_xout(j) is around 137.77 and the imaginary part q_xout(j) is around 31.92 based on equation (1). At the end of the third clock cycle, the value of rotation angle signal, phi(j), is updated to −31.95−0.2*31.92, which is around −38.34 degrees, based on equation (5). During a fourth clock cycle, because the value of rotation angle signal, phi(j), is around −38.34 degrees, the complex multiplier generates an output complex signal whose the real part i_xout(j) is around 140.47 and the imaginary part q_xout(j) is around 16.41 based on equation (1). At the end of the fourth clock cycle, the value of rotation angle signal, phi(j), is updated to −38.34−0.2*16.41, which is around −41.62 degrees, based on equation (5). During a fifth clock cycle, because the value of rotation angle signal, phi(j), is around −41.62 degrees, the complex multiplier generates an output complex signal whose the real part i_xout(j) is around 141.18 and the imaginary part q_xout(j) is around 8.34 based on equation (1). At the end of the fifth clock cycle, the value of rotation angle signal, phi(j), is updated to −41.62−0.2*8.34, which is around −43.29 degrees, based on equation (5). During a sixth clock cycle, because the value of rotation angle signal, phi(j), is around −43.29 degrees, the complex multiplier generates an output complex signal whose the real part i_xout(j) is around 141.36 and the imaginary part q_xout(j) is around 4.23 based on equation (1). At the end of the sixth clock cycle, the value of rotation angle signal, phi(j), is updated to −43.29−0.2*4.23, which is around −44.13 degrees, based on equation (5). During a seventh clock cycle, because the value of rotation angle signal, phi(j), is around −44.13 degrees, the complex multiplier generates an output complex signal whose the real part i_xout(j) is around 141.41 and the imaginary part q_xout(j) is around 2.14 based on equation (1). At the end of the seventh clock cycle, the value of rotation angle signal, phi(j), is updated to −44.13−0.2*2.14, which is around −44.56 degrees, based on equation (5). During an eighth clock cycle, because the value of rotation angle signal, phi(j), is around −44.56 degrees, the complex multiplier generates an output complex signal whose the real part i_xout(j) is around 141.42 and the imaginary part q_xout(j) is around 1.08 based on equation (1). Therefore, the imaginary part 248 of the output complex signal 234 is reduced in each clock cycle such that encoded information is predominantly carried by the real part 246 of the output complex signal. Because the information is predominantly carried by the real part of the output complex signal, information can be decoded from the real part of the output complex signal by a digital signal processor (e.g., using decoding and bit-slicing operations to form the logical representations of true and false), thereby reducing or even eliminating the need to decode the imaginary part of the output complex signal to recover the carried information. Consequently, a separate decoder is not needed to decode the imaginary part of the output complex signal. Additionally, a separate/parallel decoding and bit-slicing chain is not needed within a digital decoder to decode the real part of the output complex signal. At the end of the eighth clock cycle, the value of rotation angle signal, phi(j), is updated to −44.56−0.2*1.08, which is around −44.78 degrees, based on equation (5).

TABLE 1

| Clock Cycle | IQ data | phi (degrees) | cos(phi) | sin(phi) | real | imaginary |
|---|---|---|---|---|---|---|
| 1 | 100 | 0 | 1 | 0 | 100 | 100 |
| 2 | 100 | −20.00 | 0.94 | 0.34 | 128.17 | 59.77 |
| 3 | 100 | −31.95 | 0.85 | −0.53 | 137.77 | 31.92 |
| 4 | 100 | −38.34 | 0.78 | −0.62 | 140.47 | 16.41 |
| 5 | 100 | −41.62 | 0.75 | −0.66 | 141.18 | 8.34 |
| 6 | 100 | −43.29 | 0.73 | −0.69 | 141.36 | 4.23 |
| 7 | 100 | −44.13 | −0.72 | 0.70 | 141.41 | 2.14 |
| 8 | 100 | −44.56 | 0.71 | −0.70 | 141.42 | 1.08 |

Figure 3:
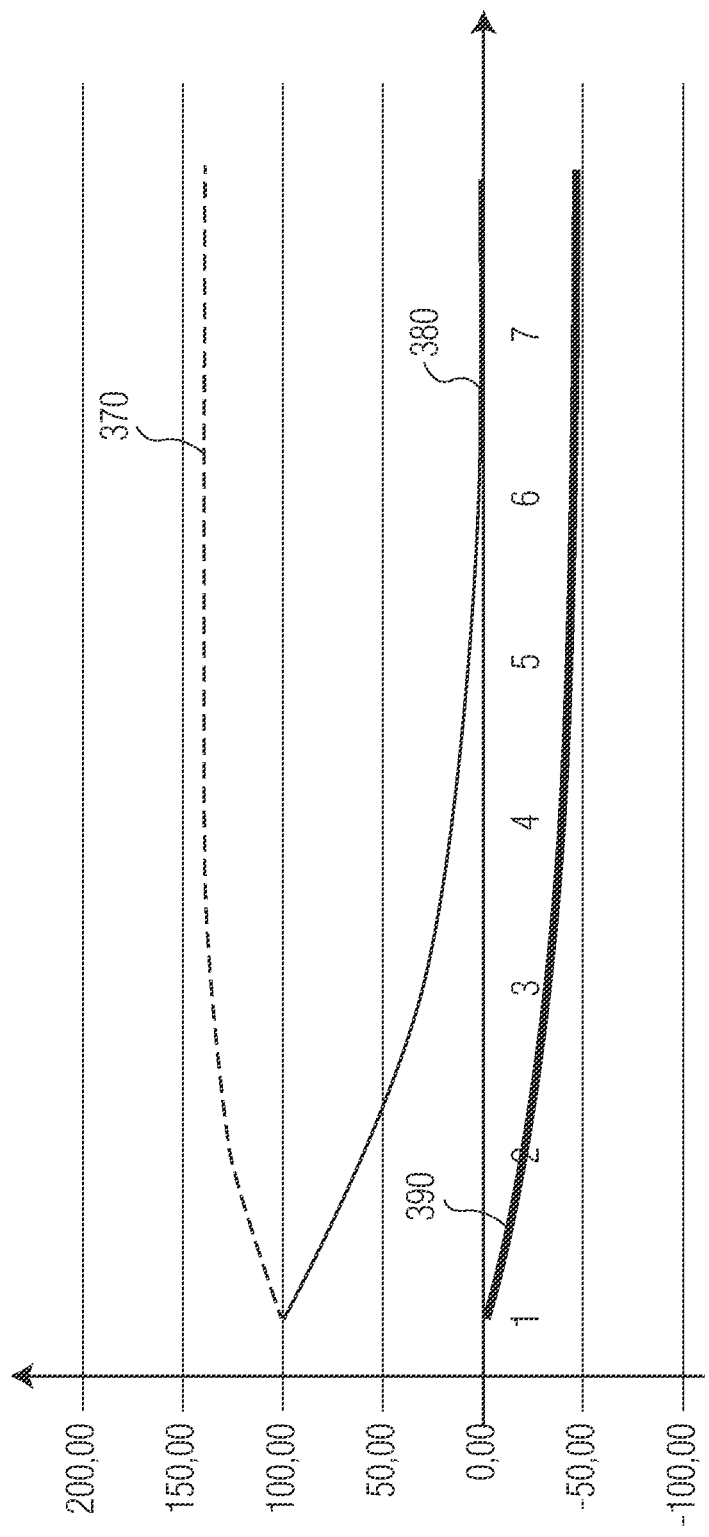
FIG. 3 is a plot of the real part and the imaginary part of an output complex signal of a complex multiplier of a phase rotator as depicted in FIG. 2 and a rotation angle signal in an example operation of the phase rotator.

FIG. 3 is a plot of the real part 246 and the imaginary part 248 of the output complex signal of the complex multiplier 234 as depicted in FIG. 2 and the rotation angle signal phi in an example operation of the phase rotator 220. In the plot depicted in FIG. 3, a curve 370 represents the real part of the output complex signal, a curve 380 represents the imaginary part of the output complex signal, and a curve 390 represents the rotation angle signal phi. As shown in FIG. 3, the imaginary part of the output complex signal and the rotation angle signal phi decreases during each clock cycle while the real part of the output complex signal increases during each clock cycle. Therefore, encoded information is predominantly carried by the real part of the output complex signal. Consequently, information can be decoded from the real part of the output complex signal by a digital signal processor (e.g., using decoding and bit-slicing operations to form the logical representations of true and false).

Figure 4:
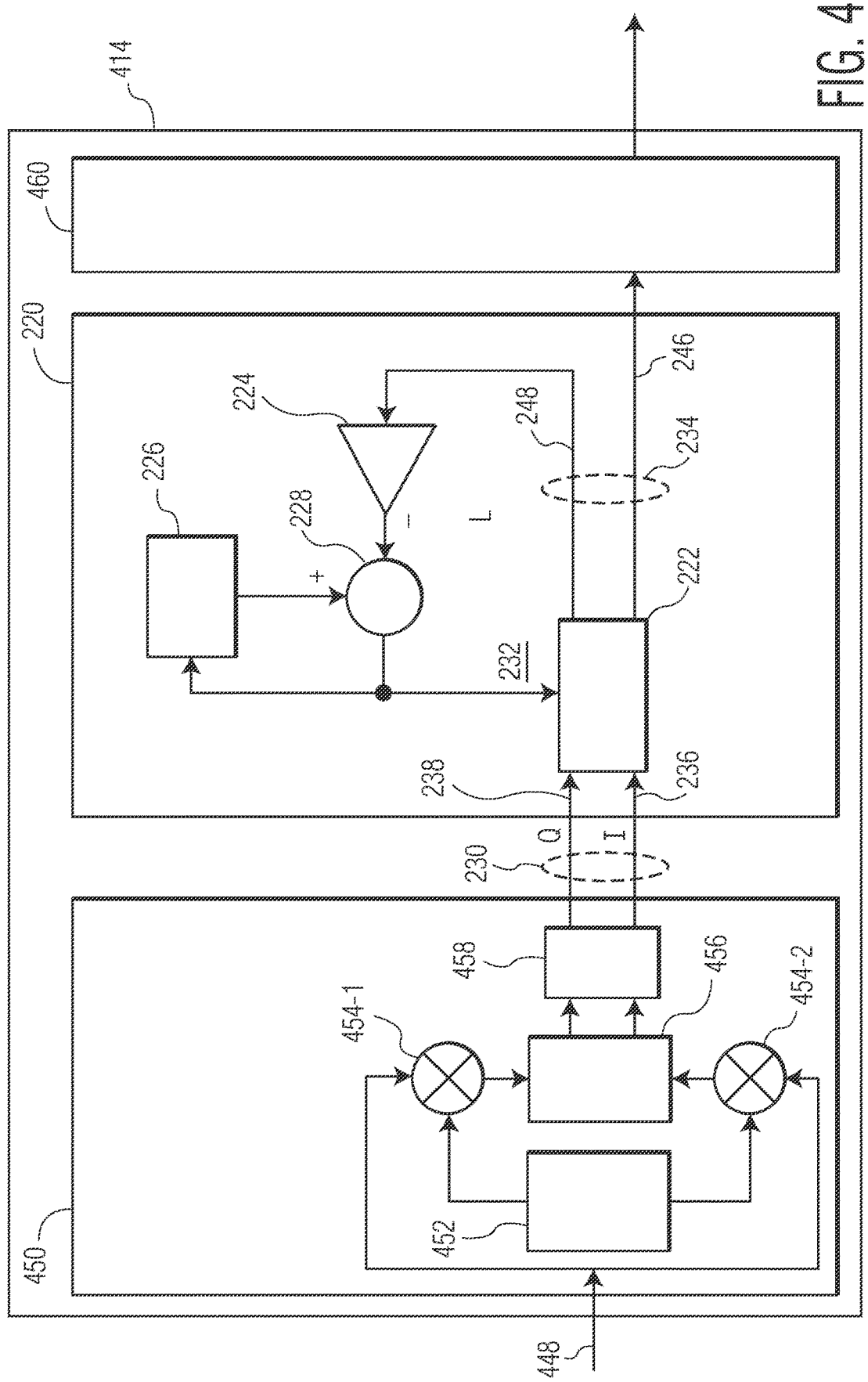
FIG. 4 depicts another embodiment of a receiver unit, which may be an embodiment of an RF transceiver of the communications device and/or an RF transceiver of the counterpart communications device depicted in FIG. 1.

FIG. 4 depicts a receiver unit 414 that is an embodiment of the RF transceiver 114 of the communications device 102 and/or the RF transceiver 124 of the counterpart communications device 104 depicted in FIG. 1. The difference between the receiver unit 414 depicted in FIG. 4 and the receiver unit 214 depicted in FIG. 2 is that the receiver unit 414 depicted in FIG. 4 further includes a baseband IQ demodulator 450 configured to generate complex inputs for the phase rotator 220 and a decoder 460 configured to decode outputs of the phase rotator. Specifically, in the embodiment depicted in FIG. 4, the receiver unit includes the baseband IQ demodulator, which includes a clock source 452, separate Q and I mixers 454-1, 454-2, a low pass filter (LPF) unit 456, and an analog-to-digital converter (ADC) unit 458, the phase rotator 220, which includes the complex multiplier 222, the amplifier 224, the delay element 226, and the subtractor 228, and the decoder 460. The receiver unit depicted in FIG. 4 is a possible implementation of the RF transceiver 114 or 124 depicted in FIG. 1. However, the RF transceiver 114 or 124 depicted in FIG. 1 can be implemented differently from the receiver unit depicted in FIG. 4. For example, in some embodiments, the receiver unit includes a digital phase locked loop (DPLL), which in turn includes a clock recovery unit and a loop filter. In another example, although the decoder is a component of the receiver unit in the embodiment depicted in FIG. 4, in other embodiments, the decoder is not part of the receiver unit.

In the embodiment depicted in FIG. 4, the baseband IQ demodulator 450 is configured to generate complex inputs for the phase rotator 220 based on an RF input signal 448. In some embodiments, the RF input signal is received from the antenna 112 or the antenna 122. The baseband IQ demodulator may be implemented with one or more suitable analog or digital circuits. The clock source 452 is configured to generate clock signals for the mixers 454-1, 454-2. In some embodiments, the clock source is implemented as an oscillator. The baseband IQ demodulator can generate the baseband in-phase (I) and quadrature (Q) components based on the RF input signal and the clock signals. The separate I and Q mixers are configured to mix the clock signals with the RF signal. The LPF unit 456 is configured to filter higher frequency signal components of output signals from the mixers. The ADC unit 458 is configured to convert one or more analog signals from the LPF unit into digital I/Q data, which is input into the phase rotator. In an example operation of the baseband IQ demodulator, the RF input signal from a receiver antenna is mixed with a local clock signal at the separate I and Q mixers. The mixer outputs are low-pass filtered and converted into digital I/Q signals, which are output to the complex multiplier.

Compared to a receiver that relies on a recovered clock for data reception, the receiver unit 414 depicted in FIG. 4 does not rely solely on a clock-recovery mechanism for data reception and decoding. For example, the phase rotator operates with the local clock source 452 (e.g., a local oscillator) of the baseband IQ demodulator 450 to implement data reception and decoding. Because the receiver unit depicted in FIG. 4 does not rely solely on a clock-recovery mechanism for data reception and decoding, parasitic phase modulation that may be introduced based on the proximity between the communications devices does not affect data reception and decoding at the corresponding receiver unit.

In the embodiment depicted in FIG. 4, the decoder 460 is configured to decode the real part 246 of the output complex signal 234 of the phase rotator 220 into decoded bits. The decoder may be implemented as hardware, software, firmware, and/or a combination of hardware, software, and/or firmware. In some embodiments, the decoder is implemented with one or more suitable digital logic circuits. In an embodiment, the decoder is implemented as a processor such as a microcontroller or a CPU.

FIG. 5 is a process flow diagram of a method for operating a communications device in accordance with another embodiment of the invention. At block 502, a first input complex signal is multiplied with a second input complex signal to generate an output complex signal. At block 504, an imaginary part of the output complex signal is amplified to generate an amplification result. At block 506, a rotation angle signal that is related to the second input complex signal is delayed. At block 508, the amplification result is subtracted from the delayed rotation angle signal to generate the rotation angle signal. The communications device may be the same or similar to the communications devices described above with respect to FIGS. 1-4.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random-access memory (RAM), a read-only memory (ROM), a rigid magnetic disc, and an optical disc. Current examples of optical discs include a compact disc with read only memory (CDROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A communications device, the communications device comprising:
   a complex multiplier configured to multiply a first input complex signal with a second input complex signal to generate an output complex signal;
   an amplifier configured to amplify an imaginary part of the output complex signal to generate an amplification result;
   a delay element configured to delay a rotation angle signal that is related to the second input complex signal; and
   a subtractor configured to subtract the amplification result from the delayed rotation angle signal to generate the rotation angle signal.

2. The communications device of claim 1, wherein the first input complex signal comprises a real part that is a baseband in-phase (I) component and an imaginary part that is a baseband quadrature (Q) component.

3. The communications device of claim 2, further comprising a baseband IQ demodulator configured to generate the baseband in-phase (I) and quadrature (Q) components based on a radio frequency (RF) input signal.

4. The communications device of claim 3, wherein the baseband IQ demodulator comprises a clock source configured to generate a clock signal, and wherein the baseband IQ demodulator is configured to generate the baseband in-phase (I) and quadrature (Q) components based on the RF input signal and the clock signal.

5. The communications device of claim 1, wherein the second input complex signal is represented as:

$$\cos(phi(j))+1i*\sin(phi(j)),$$

where phi is the rotation angle signal, and where j is complex unit.

6. The communications device of claim 1, wherein the complex multiplier is configured to output a real part of the output complex signal for decoding.

7. The communications device of claim 1, further comprising a decoder configured to decode a real part of the output complex signal.

8. The communications device of claim 1, wherein the amplifier is configured to amplify the imaginary part of the output complex signal by an amplification gain.

9. A method for operating a communications device, the method comprising:
   multiplying a first input complex signal with a second input complex signal to generate an output complex signal;
   amplifying an imaginary part of the output complex signal to generate an amplification result;
   delaying a rotation angle signal that is related to the second input complex signal; and
   subtracting the amplification result from the delayed rotation angle signal to generate the rotation angle signal.

10. The method of claim 9, wherein the first input complex signal comprises a real part that is a baseband in-phase (I) component and an imaginary part that is a baseband quadrature (Q) component.

11. The method of claim 10, further comprising generating the baseband in-phase (I) and quadrature (Q) components based on a radio frequency (RF) input signal.

12. The method of claim 11, further comprising obtaining a clock signal, wherein generating the baseband in-phase (I) and quadrature (Q) components based on the RF input signal comprises generating the baseband in-phase (I) and quadrature (Q) components based on the RF input signal and the clock signal.

13. The method of claim 9, wherein the second input complex signal is represented as:

$$\cos(phi(j))+1i*\sin(phi(j)),$$

where phi is the rotation angle signal, and where j is complex unit.

14. The method of claim 9, further comprising outputting a real part of the output complex signal for decoding.

15. The method of claim 9, further comprising decoding a real part of the output complex signal.

* * * * *